United States Patent [19]

Stevens et al.

[11] Patent Number: 5,302,803
[45] Date of Patent: Apr. 12, 1994

[54] APPARATUS AND METHOD FOR UNIFORM MICROWAVE PLASMA PROCESSING USING $TE_{11}$ AND $TM_{01}$ MODES

[75] Inventors: James E. Stevens, Princeton; Joseph L. Cecchi, Lawrenceville, both of N.J.

[73] Assignee: Consortium for Surface Processing, Inc., Princeton, N.J.

[21] Appl. No.: 812,695

[22] Filed: Dec. 23, 1991

[51] Int. Cl.$^5$ .......................... B23K 9/00; H05H 1/46
[52] U.S. Cl. ........................ 219/121.43; 219/121.41; 219/695; 156/345; 204/298.38
[58] Field of Search ............. 219/121.43, 121.41, 219/12.144, 10.55 B, 10.55 A, 10.55 F; 156/345, 646; 204/298.37, 298.38, 298.17; 118/722; 315/111.41, 111.81, 111.21

[56] References Cited

U.S. PATENT DOCUMENTS

| | | | |
|---|---|---|---|
| 4,417,178 | 11/1983 | Geller et al. | 315/111.81 |
| 4,450,031 | 5/1984 | Ono et al. | 156/345 |
| 4,507,588 | 3/1985 | Asmussen et al. | 315/111.81 |
| 4,687,616 | 8/1987 | Moeller | 219/121.43 |
| 4,727,293 | 2/1988 | Asmussen et al. | 315/111.81 |
| 4,788,473 | 11/1988 | Mori et al. | 315/111.81 |
| 4,831,963 | 5/1989 | Saito et al. | |
| 4,859,908 | 7/1989 | Yoshida et al. | 315/111.81 |
| 4,866,346 | 9/1989 | Gaudreau et al. | 315/111.51 |
| 4,876,983 | 10/1989 | Fukuda et al. | 118/722 |
| 4,877,509 | 10/1989 | Ogawa et al. | 156/345 |
| 4,970,435 | 11/1990 | Tanaka et al. | 315/111.21 |
| 4,987,284 | 1/1991 | Fujimura et al. | 219/121.43 |
| 5,003,152 | 3/1991 | Matsuo et al. | 219/121.59 |
| 5,111,111 | 5/1992 | Stevens et al. | 315/111.41 |

OTHER PUBLICATIONS

*Non-Linear Electromagnetic Wave Transformation in a Longitudinally Magnetized Plasma Waveguide*, Vegas, A. et al., Plasma Physics and Controlled Fusion, vol. 26, No. 12B, pp. 1579 to 1589 (1984).
*Plasma Etching With a Microwave Cavity Plasma Disk Source*, Hopwood, J. et al., J. Vac. Sci. Technol. B 6 (1), pp. 268–271, Jan./Feb. 1988.

*Primary Examiner*—Mark H. Paschall
*Attorney, Agent, or Firm*—Bell, Seltzer, Park & Gibson

[57] ABSTRACT

A plasma processing apparatus and method using a predetermined proportion of relative power between a $TE_{11}$ mode and a $TM_{01}$ mode to produce radial uniformity of the plasma. A microwave coupler transforms microwave energy from a microwave source into approximately equal proportions of $TE_{11}$ and $TM_{01}$ modes. In one embodiment, the coupler includes a first arm for generating the $TE_{11}$ mode and a second arm for generating the $TM_{01}$ mode which are then combined in a cylindrical waveguide section having a sufficient inner diameter to support propagation of both modes. Other circuit components are provided to prevent cross-coupling of the $TE_{11}$ mode into the $TM_{01}$ generating arm, and vice versa. Thus, the relative proportion of power of each mode may be independently controlled. A magnetic field generator may be used in the apparatus to create an electron cyclotron resonance condition within the plasma.

31 Claims, 5 Drawing Sheets

APPARATUS AND METHOD FOR UNIFORM MICROWAVE PLASMA PROCESSING USING $TE_{11}$ AND $TM_{01}$ MODES

FIELD OF THE INVENTION

The present invention relates to the field of plasma processing and, more particularly, to an apparatus and method to produce a radially uniform plasma for plasma processing.

BACKGROUND OF THE INVENTION

Microwave sources have been used to create plasmas adjacent a sample, such as a semiconductor substrate or other work piece, positioned within an evacuable processing chamber. During processing, the sample may typically either be etched or a thin film of material deposited thereon. In a typical plasma processing system, microwave energy is fed from a source, through a waveguide coupler, and into the evacuable processing chamber. The microwave energy interacts with a feed gas within the chamber to produce a plasma.

A particular type of microwave plasma processing system, the Electron Cyclotron Resonance (ECR) system, includes a magnetic field generator which produces a magnetic field that interacts with the feed gas excited by the microwave energy to create an electron cyclotron resonance condition of the electrons in the feed gas to thereby produce the plasma. An ECR system offers a number of advantages over other types of conventional plasma processing systems. For example, an ECR system provides electrodeless operation which reduces chamber wall contamination. The low plasma potential operation reduces ion induced surface damage to the sample. Moreover, high plasma density and low pressure operation can produce high deposition and etching rates with low particulate formation. These advantages have become increasingly important for processing state-of-the-art integrated circuits as device features are reduced to submicron dimensions.

The general design and operation of ECR systems in described in U.S. Pat. No. 4,859,908 to Yoshida et al. entitled *Plasma Processing Apparatus for Large Area Ion Irradiation;* U.S. Pat. No. 4,727,293 to Asmussen et al. entitled *Plasma Generating Apparatus Using Magnets and Methods;* U.S. Pat. No. 4,417,178 to Geller et al. entitled *Process and Apparatus for Producing Highly Charged Large Ions and an Application Utilizing This Process;* and Japanese published patent application 88-310887/44 entitled *Film Forming Plasma-Generating Machine.*

Present efforts to improve ECR systems have focused on increasing one or both of the efficiency of plasma generation, or the uniformity of the plasma generated. U.S. Pat. No. 5,003,152, to Matsuo et.al. for example, discloses a microwave coupler positioned between the source and the processing chamber that has a fixed dielectric slab mode transformer for converting an incident circular-waveguide $TE_{11}$ mode into a hybrid TE/TM mode with an unspecified fraction of TM component. The hybrid mode contains both TE and TM components and, thus, can propagate only in the presence of the dielectric slab and plasma. The microwave coupler is directed toward improving the matching of the microwave energy to the plasma to increase the efficiency of plasma generation by more effectively coupling the microwave energy of the source to the plasma.

While efficiency is desirable so that a high density plasma can be generated using minimal microwave and magnetic power, uniformity is also a critical processing parameter to ensure uniform deposition or etching conditions across the entire sample surface. For example, as the size of semiconductor substrates increases, the need for uniformity in plasma processing becomes more critical. For example, U.S. Pat. No. 4,866,346 to Gaudreau et al. and entitled *Microwave Plasma Generator* discloses coupling a transverse magnetic mode with no angular dependence, such as the $TM_{01}$ mode, from the microwave source to the plasma to thereby produce a circularly symmetric plasma. Unfortunately, the intensity of the microwave power flux produced is radially dependent and not uniform across the entire sample.

Another attempt at increasing uniformity by selecting the microwave source and its associated microwave coupler to produce a desired microwave energy is disclosed in U.S. Pat. No. 4,877,509 to Ogawa et al. entitled *Semiconductor Wafer Treating Apparatus Utilizing a Plasma.* The Ogawa et al. patent discloses a rectangular waveguide having a rectangular-to-circular converter and a circular polarization converter for transforming the circular $TE_{11}$ mode from the source into a circularly polarized wave. Thus, the electric field strength of the microwave supplied into the evacuable chamber is azimuthally symmetric when averaged over time, to thereby create a more azimuthally uniform plasma density. However, the intensity of the microwave power flux is also radially nonuniform.

The magnetic field may also be shaped in an attempt to obtain greater overall uniformity of the plasma. For example, European Patent Application 87/311,451.6 to Nakamura et al entitled *Plasma Apparatus* describes an ECR system having a second magnet in addition to the primary magnet. The second magnet provides a more even distribution of the flux adjacent to the substrate being processed.

Despite continuing improvements in microwave plasma processing systems in general, and ECR systems in particular, there still exists a need for improvement in the radial uniformity of the plasma generated using a microwave source to produce a plasma in a processing chamber. This uniformity is critical as line widths and other semiconductor dimensions are decreased or as larger semiconductor substrates are used.

SUMMARY OF THE INVENTION

It is therefore an object of the present invention to provide a microwave plasma processing apparatus and method for producing enhanced radial uniformity of the plasma.

It is a further object of the present invention to provide a microwave plasma processing apparatus and method for producing a radially uniform plasma which is less dependent on the plasma load and less dependent of any magnetic field.

These and other objects according to the present invention are provided by a microwave plasma processing apparatus that includes a microwave coupler having an input portion communicating with microwave power source means and an output portion communicating with a processing chamber, and wherein the microwave coupler includes means for generating a $TE_{11}$ mode and a $TM_{01}$ mode having predetermined relative proportions of power at the output portion of the coupler. The predetermined relative proportions of the $TE_{11}$ mode and the $TM_{01}$ mode are selected to provide substantially radially uniform plasma within the processing chamber.

The apparatus includes a conventional plasma processing chamber, means for providing a feed gas within the processing chamber, and microwave power source means communicating with the processing chamber for generating a plasma from the feed gas within the processing chamber. As would be readily understood by those skilled in the art, the present invention may further include magnetic field generating means positioned adjacent the processing chamber and cooperating with the microwave power source to produce an electron cyclotron resonance condition in the plasma. Stated in other words, an ECR system may be provided according to the invention having substantially radially uniform plasma.

The relative proportion of power produced at the output portion of the microwave coupler is preferably about 50 percent $TE_{11}$ mode and about 50 percent $TM_{01}$ mode for achieving radial uniformity of the plasma. The relative proportion of power of the $TE_{11}$ mode may also be desirably selected within the range of about 30 to 70 percent with 100 percent defined as the combined power of the $TE_{11}$ and $TM_{01}$ modes. The substantially radially uniform plasma produced by the present invention provides uniform processing. In addition, the present invention does not require that adjustments to the magnetic field be compromised in an attempt to achieve radial uniformity. Thus, adjustments to the magnetic field may be controlled to produce other desirable effects, such as better control of the electron energy distribution function for the plasma.

In one embodiment of the invention, a single microwave power source may be fed through a magic-T or other hybrid power splitter to supply two separate arms —a first arm for generating the $TE_{11}$ mode and a second arm for generating the $TM_{01}$ mode. The microwave source typically provides the microwave power in the $TE_{11}$ mode. An output portion of the microwave coupler includes means for combining the $TE_{11}$ mode and $TM_{01}$ mode, such as a circular waveguide having an inner diameter sufficient to support propagation of both the $TE_{11}$ mode and $TM_{01}$ mode at the predetermined frequency of the microwave power source means.

The first arm, or means for generating the $TE_{11}$ mode, preferably includes means for preventing the $TM_{01}$ mode from propagating therein. The second arm, or means for generating the $TM_{01}$ mode, preferably includes means for preventing the $TE_{11}$ mode from propagating therein. Accordingly, the relative power of each of the $TE_{11}$ mode and $TM_{01}$ mode is thus independently controllable.

The method according to the present invention includes the steps of generating microwave power for producing a plasma from the feed gas within the processing chamber, and coupling the generated microwave power to the processing chamber at a $TE_{11}$ mode and a $TM_{01}$ mode in predetermined relative proportions of power to provide substantially radially uniform plasma within the processing chamber. The step of coupling the generated microwave power to the processing chamber includes transforming a first portion of the predetermined mode generated to the $TE_{11}$ mode, and transforming a second portion of the predetermined mode generated to the $TM_{01}$ mode.

The steps of transforming the first portion of the predetermined mode generated to the $TE_{11}$ mode and the second portion to the $TM_{01}$ mode preferably each include independently controlling the relative power of each of the $TE_{11}$ mode and the $TM_{01}$ mode independently of the power of the other. The relative proportion of power of the $TE_{11}$ mode is preferably within the range of about 30 to 70 percent of the combined power.

DESCRIPTION OF THE PREFERRED EMBODIMENT

The present invention will now be described more fully hereinafter with reference to the accompanying drawings, in which preferred embodiments of the invention are shown. This invention may, however, be embodied in many different forms and should not be construed as limited to the embodiments set forth herein. Rather, applicants provides these embodiments so that this disclosure will be thorough and complete, and will fully convey the scope of the invention to those skilled in the art. Like numbers refer to like elements throughout and prime notation is used to indicate similar elements of various embodiments throughout.

Figure 1:
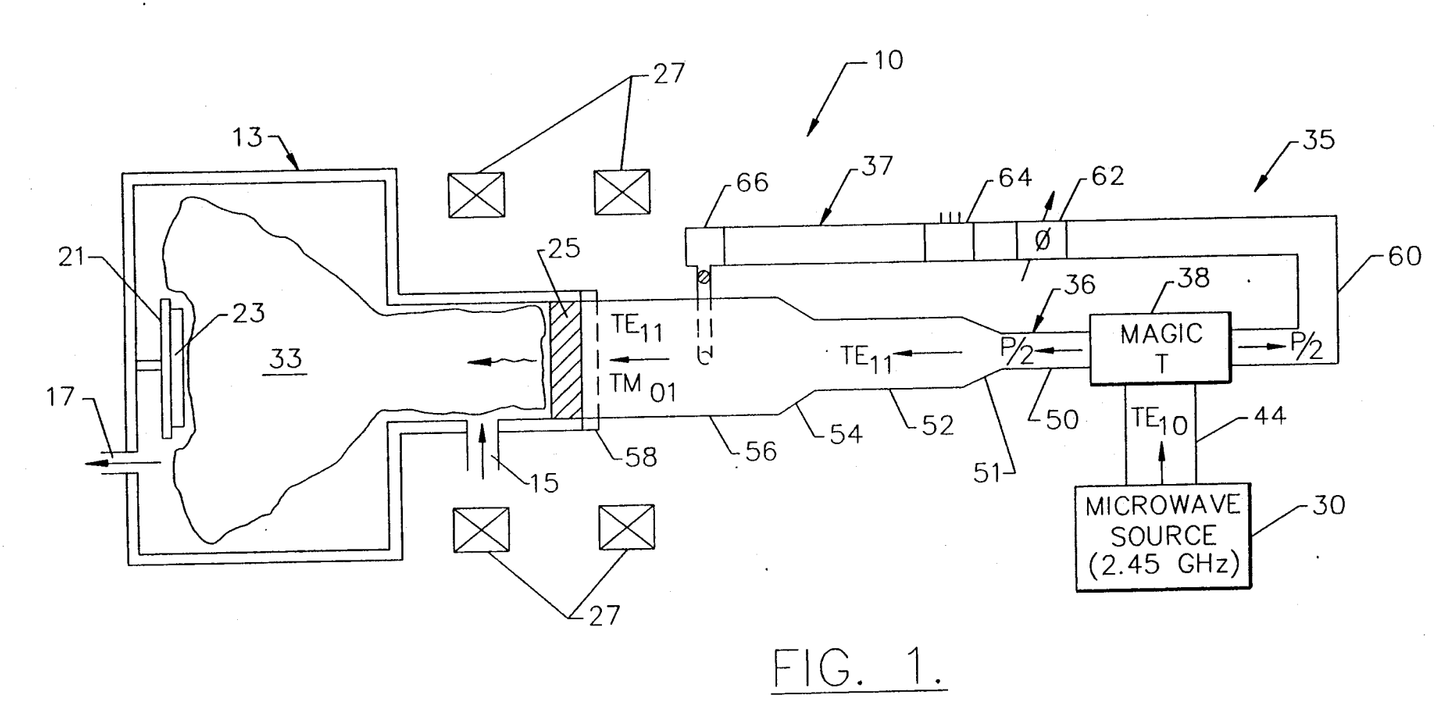
FIG. 1 is a schematic cross-sectional view of a first embodiment of the plasma processing apparatus according to the present invention.

An embodiment of the plasma processing apparatus 10 according to the present invention is shown in FIG. 1. The embodiment shown is directed to an ECR system, although as would be readily understood by those skilled in the art, the features of the present invention may be readily used in other plasma processing equipment, even where no magnetic field is used, such as for plasma enhanced chemical vapor deposition.

The plasma processing apparatus 10 includes a conventional processing chamber 13, having a feed gas inlet port 15 and an exhaust outlet port 17. In addition, a substrate holder 21 is provided within the chamber 13 to receive a substrate 23 or other work piece thereon. A transparent vacuum window 25 is provided in a portion of the processing chamber 13 for admitting the microwave energy from the microwave power source 30. The transparent vacuum window 25 provides a vacuum seal for the chamber 13, while allowing microwave energy to pass therethrough. Magnetic field generating means, such as electromagnetic coils 27, may be provided to generate a magnetic field of sufficient intensity to create an electron cyclotron resonance condition in the plasma 33 within the chamber, as would be readily understood by those skilled in the art. For example, typical ECR plasma processing systems use a microwave frequency of 2.45 GHz and a corresponding magnetic field strength of about 875G at the resonance point.

Figure 2:
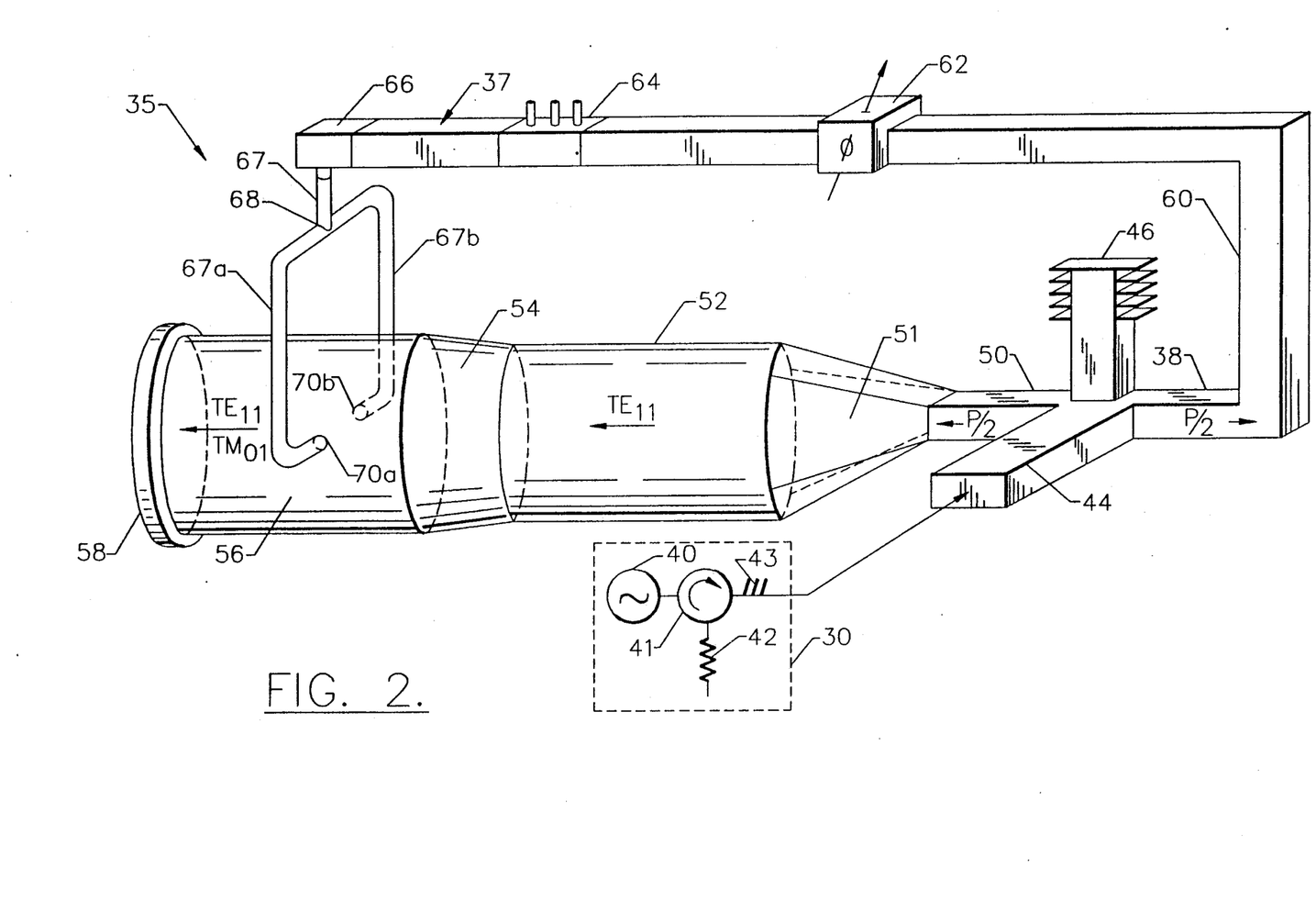
FIG. 2 is a schematic perspective view of the microwave coupler shown in FIG. 1.

As shown in FIGS. 1 and 2, a first embodiment of the microwave coupler 35 according to the invention includes a first arm 36 and second arm 37 for generating substantially equal power proportions of $TE_{11}$ and $TM_{01}$ modes, respectively, from a magic-T 38. As is well known to those skilled in the art, the magic-T 35 receives the power from the microwave source 30 and divides the power substantially equally into the two arms. As would be readily understood by those skilled in the art, an alternative approach is to provide two separate microwave power supplies with each one feeding a respective arm of the coupler 35.

The microwave power source 30 may be a standard 2.45 GHz microwave power source including a power source 40, a circulator 41, a high power load 42, a 3-stub tuner 43, and an interconnecting waveguide 44. Forward power from the microwave power source 30 is fed into the magic-T 38, typically in the $TE_{10}$ mode. The magic-T 38 divides the power between the first arm 36 and the second arm 37. The magic-T 38 may also include a dummy load 46 connected thereto so that any reflected power returning back from the first and second arms will return into the dummy load 46 or be reflected back to the microwave source 30 depending on the phase and amplitude of the two reflected signals.

First considering the 50 percent of the forward power which enters into the first arm 36, this power travels along a first waveguide section 52 and is transformed from a $TE_{10}$ rectangular waveguide mode to a $TE_{11}$ circular waveguide mode by a first flared waveguide section 51. A polarizing waveguide section 52 may optionally be used to convert the linearly polarized $TE_{11}$ mode into a $RHCP-TE_{11}$ mode, as would be readily understood by those skilled in the art. Polarizing the $TE_{11}$ mode is not essential in an ECR system, because the plasma will absorb only the RHCP component in such a system. The energy from the polarizing waveguide section 52 propagates through a second flared waveguide section 54 into a circular waveguide section 56 which has a sufficiently large inner diameter to support propagation of both the $TE_{11}$ mode and the $TM_{01}$ mode as described in greater detail below. The circular waveguide section 56 may be connected to the processing chamber 13 by a conventional flange 58 and fasteners, not shown.

The $RHCP-TE_{11}$ mode is almost completely matched to the ECR plasma 33 if the vacuum window 25 is a quarter wavelength thick with the proper dielectric constant depending on plasma density and magnetic field. Coupling to a non-ECR system may also introduce a mismatch. Any mismatched $TE_{11}$ power from the vacuum window 25 and plasma 33 eventually returns back through the first arm 36 where it combines with power returning back through the second arm 37 and is dissipated into the dummy load 46 or returns to the microwave power source 30.

Now considering the other 50 percent of the forward power which enters into the second arm 37 of the microwave coupler 35, this power propagates in a rectangular waveguide section 60 as a $TE_{10}$ rectangular waveguide mode through a phase shifter 62, a three stub (or other) tuner 64, and is coupled into a coaxial transmission line 67 by a conventional transition 66. The rectangular waveguide section 60 may preferably be WR-284 and the coax transmission line may preferably be $\frac{7}{8}''$ hardline for the T-junction 68 into the first coaxial line 67a and the second coaxial line 67b. The two coaxial lines 67a, 67b have end portions of their center conductors extending as probes 70a, 70b (FIG. 2) into the circular waveguide section 56.

The probes 70a, 70b feed the circular waveguide section 56 at locations spaced 180 degrees apart. In addition, the coaxial lines 67a, 67b have lengths differing by an integer multiple of the microwave wavelength so that power from the T-junction 68 drives the probes 70a, 70b on the opposite sides of the circular waveguide section 56 in phase. Thus, the two probes 70a, 70b will couple only to a waveguide mode in the circular waveguide section 56 which has in-phase radial electric fields at locations on opposite sides of the waveguide. Stated in other words, the probes 70a, 70b couple to the $TM_{01}$ mode and not to the $TE_{11}$ mode. Since the $TM_{01}$ mode is an unpolarized mode in the circular waveguide section 56, at best about 50 percent of the incident power will couple into the vacuum window 25 and plasma 33 in an ECR system. Coupling of the $TM_{01}$ mode in a non-ECR system may also produce a mismatch. The tuner 64 can be set to tune out this mismatch along with the mismatches arising from the power splitting T-junction 68 and coupling circuit including the probes 70a, 70b.

Thus, it is possible to couple the $TE_{11}$ and $TM_{01}$ modes separately into the circular waveguide section 56 and through the vacuum window 25 and into the plasma 33. The $TE_{11}$ mode from the first arm 36 will not interact with the second arm 37 due to the symmetry of the two probes 70a, 70b; and the $TM_{01}$ mode from the second arm 37 will not interact with the first arm 36 because the polarizing waveguide section 52 has an inner diameter below cutoff for the $TM_{01}$ mode. Any reflected power from the first arm 36 and the second arm 37 will recombine into either the dummy load 46 or the microwave power source 30. This power is expected to be approximately equal; therefore, adjustment of the phase shifter 62 may cancel most of the reflected power from entering the dummy load 46 and instead cause it to go into the source 30 where it can be reintroduced into the system by the tuner 43. However, it has generally been found that reflected power from the RHCP component of waves incident upon the plasma 33 through a fixed quarter wavelength vacuum window 25 is less than about 10 percent and further tuning may not be needed.

The embodiment of the microwave coupler 35 illustrated in FIGS. 1 and 2 can be built in alternative ways in order to perform a 50 percent $TE_{11}$ and 50 percent $TM_{01}$ mode (or other) power split. All of the components in the first arm 36, except for the dummy load 46, are passive and thus those circuit elements can be replaced with equivalent elements or circuit elements can be combined in ways which give equivalent results. For example, the first flared waveguide section 51, polarizing waveguide section 52, and second flared waveguide section 54 may be replaced by a turnstile coupler or else by a set of components similar to those shown for the second arm 37 with a set of probes fed out-of-phase.

Figure 3:
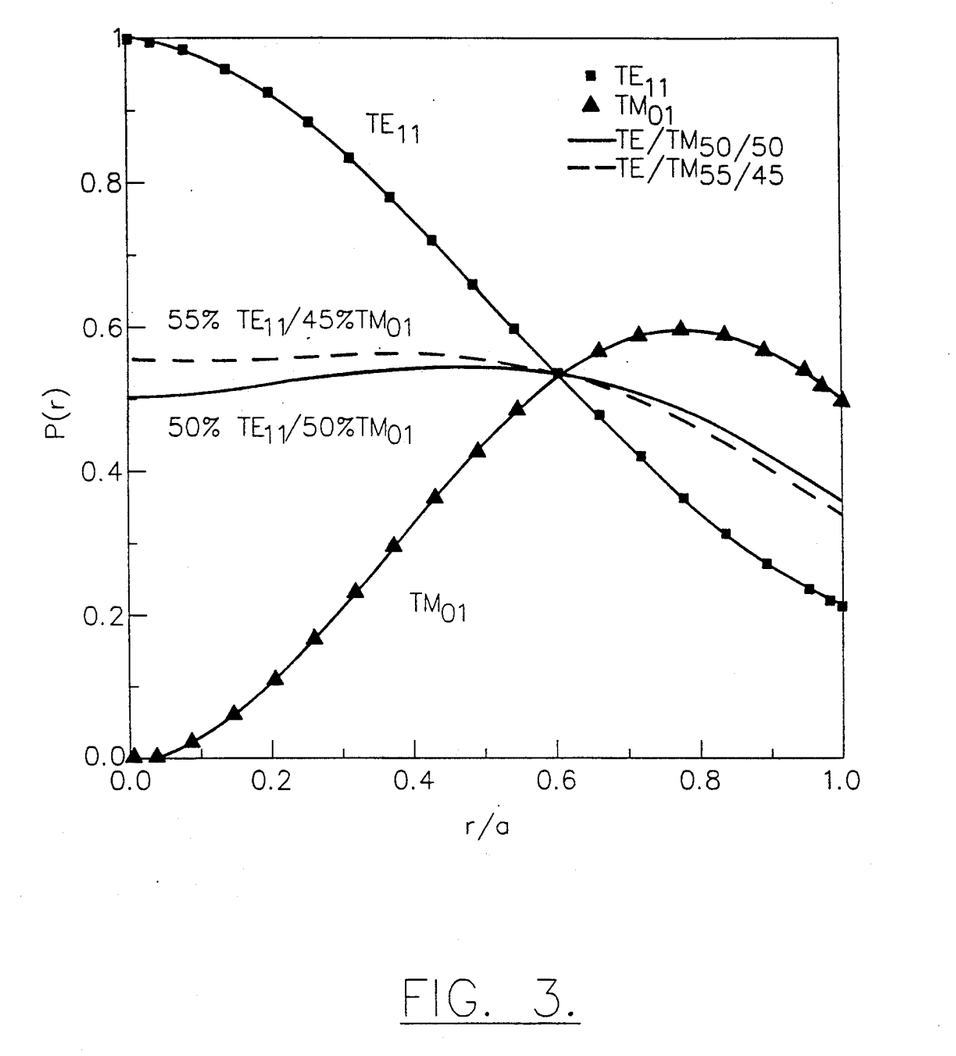
FIG. 3 is a graph of various relative proportions of power in the $TE_{11}$ mode and $TM_{01}$ mode versus radial power intensity for a plasma processing apparatus according to the, present invention, such as shown in FIG. 1.

Referring to FIG. 3, there is shown a graph illustrating the principle of the present invention. While typical ECR systems of the prior art have typically used well-defined single microwave modes, such as either the $TE_{11}$ mode or the $TM_{01}$ mode alone, the present invention includes a microwave coupler 35 which has a 50±20 percent power split between the $TE_{11}$ mode and the $TM_{01}$ mode. The present invention combines two waveguide modes, the $TE_{11}$ mode whose power is centrally peaked, and the $TM_{01}$ mode whose power is peaked at a large radius, to thereby produce an almost uniform microwave power profile over a large fraction of the desired plasma processing area.

If uniformity is defined as equal to three times the standard deviation of the power intensity function (a function of radius r) out to a radius r/a less than a predetermined value, then the present invention may produce a power uniformity of 9 percent for r/a <0.75, and a uniformity of 18 percent for r/a <0.85 as shown by the solid line in the graph of FIG. 3. In contrast, the $TE_{11}$ mode by itself has a power uniformity of 81 percent for r/a <0.75, and 100 percent for r/a <0.85, as shown by the line indicated as representing the $TE_{11}$ mode. The $TM_{01}$ mode by itself has a power uniformity of 249 percent for r/a <0.75, and 198 percent for r/a <0.85, as shown by the line indicated as representing the $TM_{01}$ mode.

FIG. 3 also shows a representative dashed-line curve for a combination of 55 percent $TE_{11}$ mode and 45 percent $TM_{01}$ mode. As can be readily seen, the combination of the $TE_{11}$ mode and $TM_{01}$ mode according to the present invention produces a more radially uniform plasma. While the plasma confinement and the plasma wave propagation may also affect the plasma uniformity, the present invention has a much higher starting uniformity than conventional plasma processing systems employing only a single mode.

Figure 4:
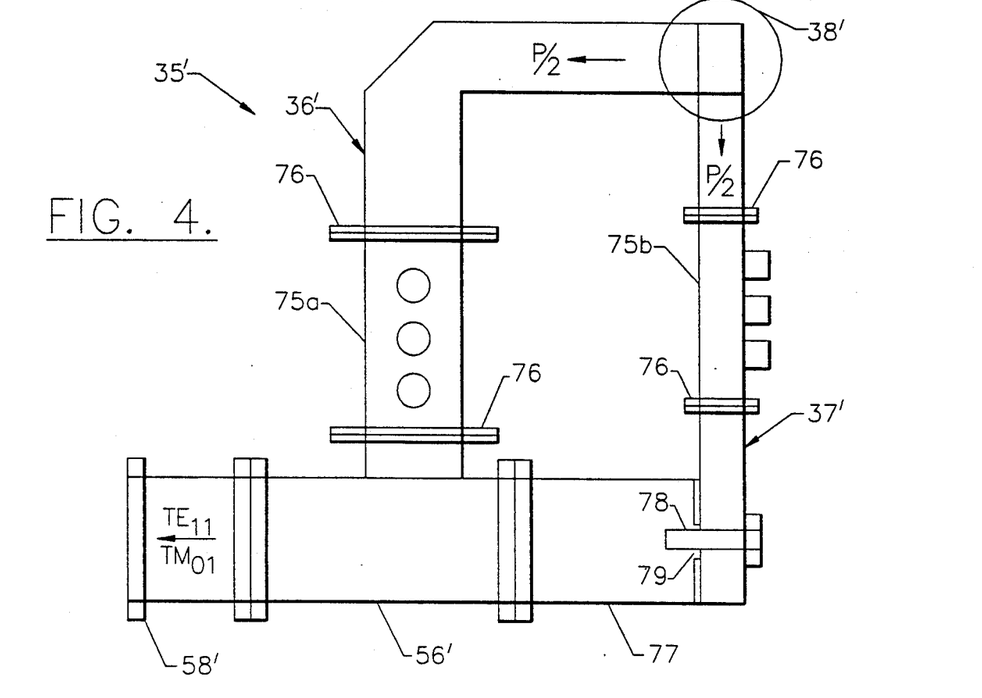
FIG. 4 is a schematic cross-sectional view of a second embodiment of a microwave coupler for a plasma processing apparatus according to the present invention.

Referring now to FIG. 4, there is shown a second embodiment of a microwave coupler 35' according to the present invention. The microwave coupler includes a first arm 36' and a second arm 37' for supplying power to generate the $TE_{11}$ mode and $TM_{01}$ mode respectively in the circular waveguide section 56'. As in the previous embodiment, each arm may be fed from a magic-T 38' or other hybrid power splitter connected to a microwave source, not shown. Each arm is constructed of conventional rectangular waveguide components, such as WR-284 rectangular waveguides, and includes conventional tuners 75a, 75b and interconnecting flanges 76.

The second arm 37' is connected to a $TM_{01}$ coupler 77, such as a $TM_{01}$ coupler manufactured by Astex, Inc., of Woburn, Mass., and as described in U.S. Pat. No. 4,866,346 to Gaudreau et al. The $TM_{01}$ coupler 77 includes a coupling post 78 which extends through an opening 79 into the interior of the coupler. The $TM_{01}$ coupler 77 is connected to a circular waveguide section 56' to which is connected the first arm 36' of the microwave coupler 35' according to the invention. Microwave power of approximately equal proportions of $TE_{11}$ and $TM_{01}$ modes is thus directed out of the output portion of the microwave coupler 35'. A flange 58' is provided at the output portion of the microwave coupler 35' for interconnecting to a processing chamber 13, such as that shown in FIG. 1. As would be readily understood by those skilled in the art, the output flange 58' may be flared to accommodate a larger sized processing chamber 13 (FIG. 1).

As is readily understood by those skilled in the art, the magic-T 38, 38' is a 3-dB directional coupler which provides a 50 percent/50 percent power split of the forward power into the first arm 36, 36' and the second arm 37, 37' of the microwave couplers 35, 35' shown in FIG. 1, 2 and 4. However, it may be desirable to have a different power split, such as the 30 percent/70 percent $TE_{11}/TM_{01}$ split, or a 55 percent/45 percent split whose radial profile is shown in FIG. 3. Thus, the magic-T 38, 38' may be replaced by a non 3-dB directional coupler. Circuits with a variable power split can replace the magic-T and can be constructed by well known microwave techniques. Alternatively, two separate microwave power supplies can replace the magic-T and single microwave source for the embodiments of the microwave coupler 38, 38' shown in FIGS. 1, 2 and 4.

Figure 5:
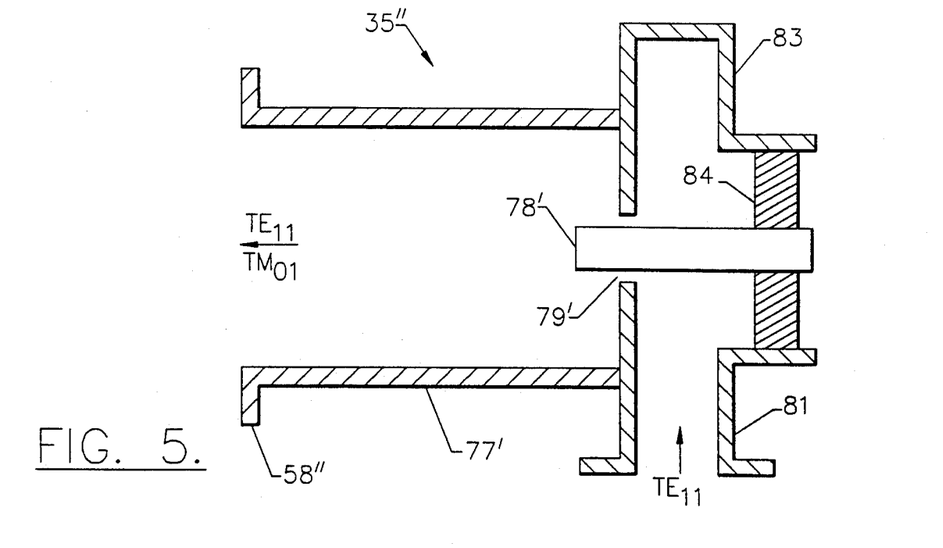
FIG. 5 is a schematic cross-sectional view of a third embodiment of a microwave coupler for a plasma processing apparatus according to the present invention.

A third embodiment of a microwave coupler 35" according to the invention is shown in FIG. 5. The microwave coupler 35" is similar to the $TM_{01}$ coupler 77 described above with reference to FIG. 4, but with modifications to permit coupling of the $TE_{11}$ mode as well. As shown in FIG. 5, microwave power in the $TE_{10}$ mode is fed into the input rectangular waveguide section 81. Opposite the input rectangular waveguide section 81 is a shorting length of rectangular waveguide 83. A coupling post 78' is positioned to adjustably extend through an opening 79' at an end of the circular waveguide section 77'. Connected to the coupling post 78' is an adjustable cylindrical waveguide shorting section 84.

A 50 percent split between the $TE_{11}$ and $TM_{01}$ modes may be achieved by proper adjustment of the coupling post 78', the size of the opening 79' for the post, the length of the shorting rectangular waveguide section 83, and the adjustable cylindrical shorting section 84.

A difficulty with the embodiment shown in FIG. 5; however, is that the reflected power from the plasma load behaves differently depending on the mode. The power split between the $TE_{11}$ and $TM_{01}$ modes may be affected by the reflected power if the reflected power cannot be handled separately for each mode. Assuming that a quarter wavelength vacuum window 25 (FIG. 1) of the correct dielectric constant is used, a RHCP mode is almost totally absorbed while a LHCP mode is almost totally reflected in an ECR system. A $TM_{01}$ mode is unpolarized and thus at best 50 percent absorbed. A $TE_{11}$ mode can have both RHCP and LHCP components. The equal power split between $TE_{11}$ and $TM_{01}$ modes produced by the microwave coupler 35" shown in FIG. 5 may be maintained in the presence of a plasma 33 (FIG. 1) with precise adjustments of the microwave coupler 35". Adjustment and measurement of the power split may be done in-situ with a plasma or simulated plasma load.

Referring again to the embodiment of the microwave coupler shown in FIGS. 1 and 2, it will be readily understood by those skilled in the art the reflected power into the dummy load 46 may be made smaller for a typical plasma 33 load by proper adjustment of the phase shifter 62. Thus, those skilled in the art may envision replacing the components of the second arm 37 with a compact passive coupler which performs the same function. While the embodiment of the microwave coupler 35" shown in FIG. 5 with adjustments set properly may achieve the same function, the microwave coupler 35" would have to be adjusted to the particular plasma load as discussed above.

A problem with a completely passive circuit, such as a shorting arm in place of the dummy load 46, is that the voltages ($V_r$) of the reflected power $P_r$ contribute to the circuit operation as $V_r \approx \sqrt{P_r}$. Thus, if $P_r \approx 10\%$ then $V_r \approx 30\%$, and small reflected powers may upset the operation of the circuit unless the plasma load is known precisely. Therefore, it is probably desirable to separate the reflected powers from the two modes and dump this reflected power into the dummy load 46 as is done in the embodiments shown in FIGS. 1, 2 and 4.

Other configurations of microwave couplers for producing predetermined proportions of $TE_{11}$ and $TM_{01}$ modes are suggested by the examples given in Microwave Transmissions Circuits, G. Ragan Ed., MIT Rad. Lab. Series #9, 1964, Chapter 6.17-6.25. FIGS. 6 and 7 to 8C, based on ideas from Ragan et. al., show two examples of how a mixture of $TE_{11}$ and $TM_{01}$ modes might be generated in a microwave coupler for use in a plasma processing apparatus. The exact location of the moveable adjustments in FIGS. 6 and 7 would have to be determined by experiment.

Figure 6:
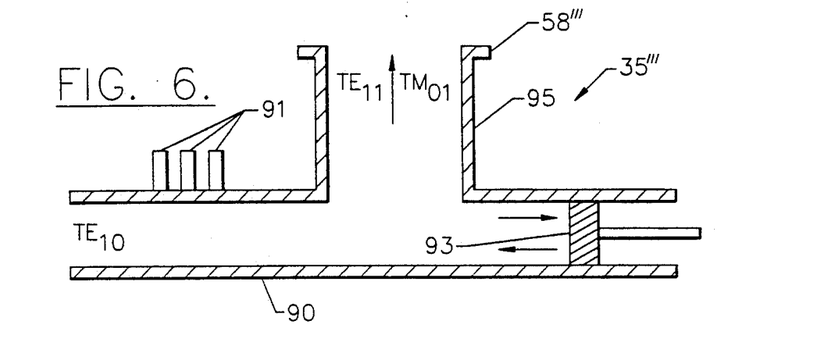
FIG. 6 is a schematic cross-sectional view of a fourth embodiment of a microwave coupler for a plasma processing apparatus according to the present invention.
Figure 7:
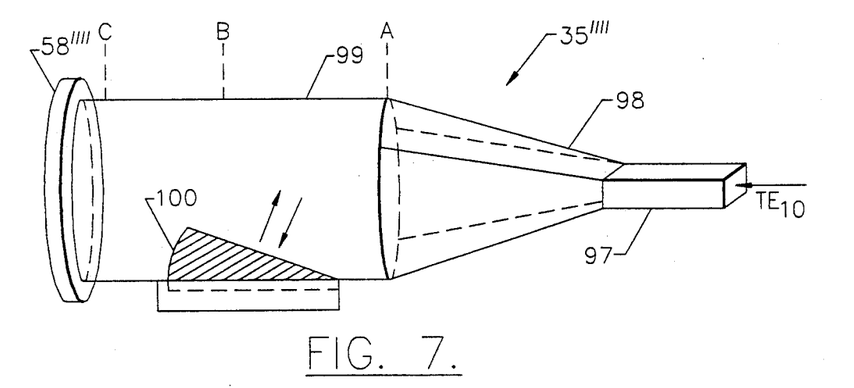
FIG. 7 is a schematic cross-sectional view of a fifth embodiment of a microwave coupler for a plasma processing apparatus according to the present invention.

In FIG. 6, the microwave coupler 35''' includes a rectangular waveguide section 90 with adjustable tuning stubs 91 positioned extending therein. Opposite the rectangular waveguide section 90 is an adjustable tuning short 93. A cylindrical waveguide section 95 is connected to the rectangular waveguide section 90 transverse thereto. The cylindrical waveguide 95 includes a coupling flange 58''' formed at the free open end thereof.

Figure 8A:
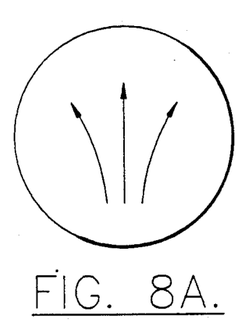
FIGS. 8A-8C are schematic diagrams illustrating the pattern of the electric field within the microwave coupler as shown in FIG. 7 at points A, B and C, respectively.
Figure 8B:
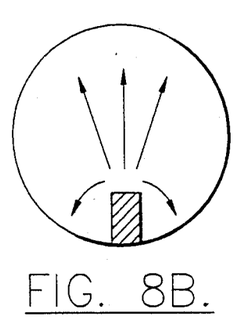
Figure 8C:
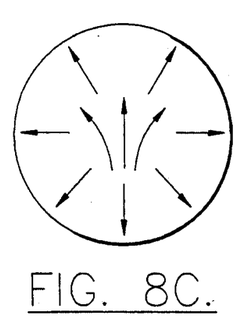

Referring to FIGS. 7 and 8A-8C, another embodiment of a microwave coupler 35'''' is shown. The microwave coupler 35'''' includes a rectangular waveguide section 97 for receiving the $TE_{10}$ mode input from a microwave source, not shown. A flared waveguide section 98 feeds a circular waveguide section 99 with an adjustable fin 100 extending therein. FIG. 8A indicates the transverse pattern of the electrical field lines at point "A" within the microwave coupler 35'''' where a pure $TE_{11}$ mode is present. FIG. 8B shows the electrical field pattern at point "B" where the fin 100 introduces an $TM_{01}$ mode component into the circular waveguide section 99. FIG. 8C shows the electrical field pattern at the output portion of the microwave coupler 35'''' where a mixture of $TE_{11}$ and $TM_{01}$ modes is present.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A plasma processing apparatus for generating a substantially radially uniform plasma, said apparatus comprising:
   a processing chamber;
   means for providing a feed gas within said processing chamber;
   microwave power source means communicating with said processing chamber for generating a plasma from the feed gas within said processing chamber; and
   a microwave coupler having an input portion communicating with said microwave power source means and an output portion communicating with said processing chamber, said microwave coupler including means for generating a $TE_{11}$ mode and a $TM_{01}$ mode from said microwave power source means having predetermined relative proportions of power so that the $TE_{11}$ mode has about 30 to 70 percent of the combined power of the $TE_{11}$ and $TM_{01}$ modes at the output portion of said coupler to provide substantially radially uniform plasma within said processing chamber.

2. The plasma processing apparatus according to claim 1 wherein the means for generating the $TE_{11}$ mode and the $TM_{01}$ mode having predetermined relative proportions of power includes means for generating substantially equal relative proportions of power of the $TE_{11}$ and $TM_{01}$ modes.

3. The plasma processing apparatus according to claim 1 wherein said microwave power source means includes means for generating a predetermined mode at a predetermined frequency.

4. The plasma processing apparatus according to claim 3 wherein said microwave coupler further comprises:
   means for generating the $TE_{11}$ mode from the predetermined mode generated from said microwave power source means; and
   means for generating the $TM_{01}$ mode from the predetermined mode generated from said microwave power source means.

5. The plasma processing apparatus according to claim 4 wherein said output portion of said microwave coupler includes means for combining the thus generated $TE_{11}$ mode and $TM_{01}$ mode.

6. The plasma processing apparatus according to claim 5 wherein said means for combining the $TE_{11}$ mode and $TM_{01}$ mode comprises a circular waveguide having an inner diameter sufficient to support propagation of both the $TE_{11}$ and $TM_{01}$ modes at the predetermined frequency of said microwave power source means.

7. The plasma processing apparatus according to claim 4 wherein said means for generating the $TE_{11}$ mode includes means for preventing the $TM_{01}$ mode from propagating therein, and wherein said means for generating the $TM_{01}$ mode includes means for preventing the $TE_{11}$ mode from propagating therein so that the relative power proportion of each of the $TE_{11}$ mode and $TM_{01}$ mode is independently controllable.

8. The plasma processing apparatus according to claim 1 wherein said input portion of said microwave coupler includes a first input port and a second input port; and further comprising a hybrid power splitter connecting said first and second input ports of said microwave coupler to said microwave power source means.

9. An electron cyclotron resonance (ECR) plasma processing apparatus for generating a substantially radially uniform plasma, said apparatus comprising:
   a processing chamber;
   means for providing a feed gas within said processing chamber;
   microwave power source means communicating with said processing chamber for generating a plasma from the feed gas within said processing chamber;
   magnetic field generating means positioned adjacent said processing chamber and cooperating with said microwave power source means for generating an electron cyclotron resonance condition in the plasma; and a microwave coupler having an input portion communicating with said microwave power source means and an output portion communicating with said processing chamber, said microwave coupler including means for generating a $TE_{11}$ mode and a $TM_{01}$ mode from said microwave power source means having predetermined relative proportions of power so that the $TE_{11}$ mode has about 30 to 70 percent of the combined power of the $TE_{11}$ and $TM_{01}$ modes at the output portion of said coupler to provide substantially radially uniform plasma within said processing chamber.

10. The ECR plasma processing apparatus according to claim 9 wherein the means for generating the $TE_{11}$ mode and the $TM_{01}$ mode having predetermined relative proportions of power includes means for generating substantially equal relative proportions of power of the $TE_{11}$ and $TM_{01}$ modes.

11. The ECR plasma processing apparatus according to claim 9 wherein said microwave power source means includes means for generating a predetermined mode at a predetermined frequency.

12. The ECR plasma processing apparatus according to claim 11 wherein said microwave coupler further comprises:
means for generating the $TE_{11}$ mode from the predetermined mode generated from said microwave power source means; and
means for generating the $TM_{01}$ mode from the predetermined mode generated from said microwave power source means.

13. The ECR plasma processing apparatus according to claim 12 wherein said output portion of said microwave coupler includes means for combining the thus generated $TE_{11}$ mode and $TM_{01}$ mode.

14. The ECR plasma processing apparatus according to claim 13 wherein said means for combining the $TE_{11}$ mode and $TM_{01}$ mode comprises a circular waveguide having an inner diameter sufficient to support propagation of the $TE_{11}$ mode and $TM_{01}$ mode at the predetermined frequency of said microwave power source means.

15. The ECR plasma processing apparatus according to claim 12 wherein said means for generating the $TE_{11}$ mode includes means for preventing the $TM_{01}$ mode from propagating therein and wherein the means for generating the $TM_{01}$ mode includes means for preventing the $TE_{11}$ mode from propagating therein so that the relative power of each of the $TE_{11}$ mode and $TM_{01}$ mode is independently controllable.

16. The ECR plasma processing apparatus according to claim 9 wherein said input portion of said microwave coupler includes a first input port and a second input port; and further comprising a hybrid power splitter connecting said first and second input ports of said microwave coupler to said microwave power source means.

17. A microwave coupler for coupling microwave energy at a predetermined mode from a microwave power source means into a plasma processing chamber to generate a substantially radially uniform plasma therein, said microwave coupler comprising:
an input portion adapted for connection to the microwave power source means;
an output portion adapted for connection to the processing chamber; and
means for generating a $TE_{11}$ mode and a $TM_{01}$ mode from the microwave source means having predetermined relative proportions of power so that the $TE_{11}$ mode has about 30 to 70 percent of the combined power of the $TE_{11}$ and $TM_{01}$ modes at said output portion to provide substantially radially uniform plasma within the processing chamber.

18. The microwave coupler according to claim 17 wherein the means for generating the $TE_{11}$ mode and the $TM_{01}$ mode having predetermined relative proportions of power includes means for generating substantially equal relative proportions of power of the $TE_{11}$ and $TM_{01}$ modes.

19. The microwave coupler according to claim 17 further comprising:
means for generating the $TE_{11}$ mode from the predetermined mode generated from the microwave power source means; and
means for generating the $TM_{01}$ mode from the predetermined mode generated from the microwave power source means.

20. The microwave coupler according to claim 19 wherein said output portion includes means for combining the thus generated $TE_{11}$ mode and $TM_{01}$ mode.

21. The microwave coupler according to claim 20 wherein said means for combining the $TE_{11}$ mode and $TM_{01}$ mode comprises a circular waveguide having an inner diameter sufficient to support propagation of both the $TE_{11}$ and $TM_{01}$ modes at the predetermined frequency of the microwave power source means.

22. The microwave coupler according to claim 17 wherein said means for generating the $TE_{11}$ mode includes means for preventing the $TM_{01}$ mode from propagating therein, and wherein said means for generating the $TM_{01}$ mode includes means for preventing the $TE_{11}$ mode from propagating therein so that the relative power proportion of each of the $TE_{11}$ mode and $TM_{01}$ mode is independently controllable.

23. The microwave coupler according to claim 17 wherein said input portion comprises a hybrid power splitter.

24. A method for generating a substantially radially uniform plasma in the processing chamber of a plasma processing apparatus, the plasma processing apparatus including means for providing a feed gas within the processing chamber, said method comprising the steps of:
generating microwave power for producing a plasma from the feed gas within the processing chamber; and
coupling the generated microwave power to the processing chamber at a $TE_{11}$ mode and a $TM_{01}$ mode in predetermined relative proportions of power so that the $TE_{11}$ mode has about 30 to 70 percent of the combined power of the $TE_{11}$ and $TM_{01}$ modes to provide substantially radially uniform plasma within the processing chamber.

25. The method according to claim 24 wherein the step of coupling the generated microwave power to the processing chamber comprises the step of generating substantially equal relative proportions of power of the $TE_{11}$ and $TM_{01}$ modes.

26. The method according to claim 24 wherein the step of generating the microwave power comprises the step of generating the microwave power at a predetermined mode at a predetermined frequency.

27. The method according to claim 26 wherein the step of coupling the generated microwave power to the processing chamber comprises the steps of:
  transforming a first portion of the predetermined mode generated to the $TE_{11}$ mode; and
  transforming a second portion of the predetermined mode generated to the $TM_{01}$ mode.

28. The method according to claim 27 wherein the steps of transforming the first portion of the predetermined mode generated to the $TE_{11}$ mode and the second portion to the $TM_{01}$ mode comprises the step of controlling the relative power of each of the $TE_{11}$ mode and the $TM_{01}$ mode independent of the power of the other.

29. The method according to claim 27 wherein the step of coupling the generated microwave power to the processing chamber further comprises the step of combining the $TE_{11}$ mode and $TM_{01}$ mode.

30. The method according to claim 24 further comprising the step of producing an electron cyclotron resonance condition in the plasma within the processing chamber.

31. The method according to claim 30 wherein the step of producing an electron cyclotron resonance condition comprises generating a magnetic field having a predetermined shape and a predetermined intensity within the processing chamber.

* * * * *